US010551414B2

(12) United States Patent
Korves et al.

(10) Patent No.: US 10,551,414 B2
(45) Date of Patent: Feb. 4, 2020

(54) INTEGRATED VOLTAGE SENSOR

(71) Applicant: COOPER TECHNOLOGIES COMPANY, Houston, TX (US)

(72) Inventors: Brian Andrew Korves, St. Francis, WI (US); William Robert Luoma, Franklin, WI (US); Paul Newcomb Stoving, Oak Creek, WI (US); Joseph Allen Carmichael, Trevor, WI (US)

(73) Assignee: Eaton Intelligent Power Limited, Dublin (IE)

( * ) Notice: Subject to any disclaimer, the term of this patent is extended or adjusted under 35 U.S.C. 154(b) by 374 days.

(21) Appl. No.: 15/478,682

(22) Filed: Apr. 4, 2017

(65) Prior Publication Data

US 2017/0285074 A1  Oct. 5, 2017

Related U.S. Application Data

(60) Provisional application No. 62/318,172, filed on Apr. 4, 2016.

(51) Int. Cl.

| *G01R 15/14* | (2006.01) |
| *H01C 1/02* | (2006.01) |
| *H01C 1/06* | (2006.01) |
| *H01C 17/02* | (2006.01) |
| *G01R 1/20* | (2006.01) |

(Continued)

(52) U.S. Cl.
CPC ........... *G01R 15/144* (2013.01); *G01R 1/203* (2013.01); *H01C 1/02* (2013.01); *H01C 1/06* (2013.01); *H01C 17/02* (2013.01); *G01R 1/18* (2013.01); *G01R 31/3274* (2013.01)

(58) Field of Classification Search
CPC ... G01R 1/203; G01R 15/146; G01R 19/0007
See application file for complete search history.

(56) References Cited

U.S. PATENT DOCUMENTS

| 5,585,611 A | 12/1996 | Harvey et al. |
| 5,698,831 A | 12/1997 | Abdelgawad et al. |
| 5,729,888 A | 3/1998 | Abdelgawad et al. |

(Continued)

FOREIGN PATENT DOCUMENTS

| DE | 2850520 A1 | 5/1980 |
| WO | 1997010515 A1 | 3/1997 |
| WO | 2009076407 A1 | 6/2009 |

OTHER PUBLICATIONS

The PCT International Search Report and Written Opinion From Corresponding Application No. PCT/US2017/025913, dated Jul. 13, 2017 (7 sheets).

*Primary Examiner* — Tung X Nguyen
(74) *Attorney, Agent, or Firm* — King & Spalding LLP

(57) ABSTRACT

A resistor assembly can include a resistor having a first end and a second end, and a conductive member, where the conductive member is coupled to the first end of the resistor. The resistor assembly can also include a shield cup and a housing, where the housing includes at least one housing wall having at least one aperture, and where the housing encloses at least a portion of the resistor and at least a portion of the shield cup. A volume of space between the at least one housing wall of the housing and the resistor can be substantially filled with an insulating material and at least the outside of the housing is substantially covered with the insulating material.

16 Claims, 14 Drawing Sheets

(51) Int. Cl.
    *G01R 31/327*     (2006.01)
    *G01R 1/18*     (2006.01)

(56) References Cited

U.S. PATENT DOCUMENTS

| | | |
|---|---|---|
| 6,331,687 B1 | 12/2001 | Dunk et al. |
| 7,473,863 B2 | 1/2009 | Schreiber et al. |
| 7,854,058 B2 | 12/2010 | Schreiber et al. |
| 9,335,348 B2 | 5/2016 | Fong et al. |
| 2010/0170774 A1 | 7/2010 | Einschenk et al. |
| 2016/0216320 A1* | 7/2016 | McTigue ........... G01R 1/06788 |

* cited by examiner

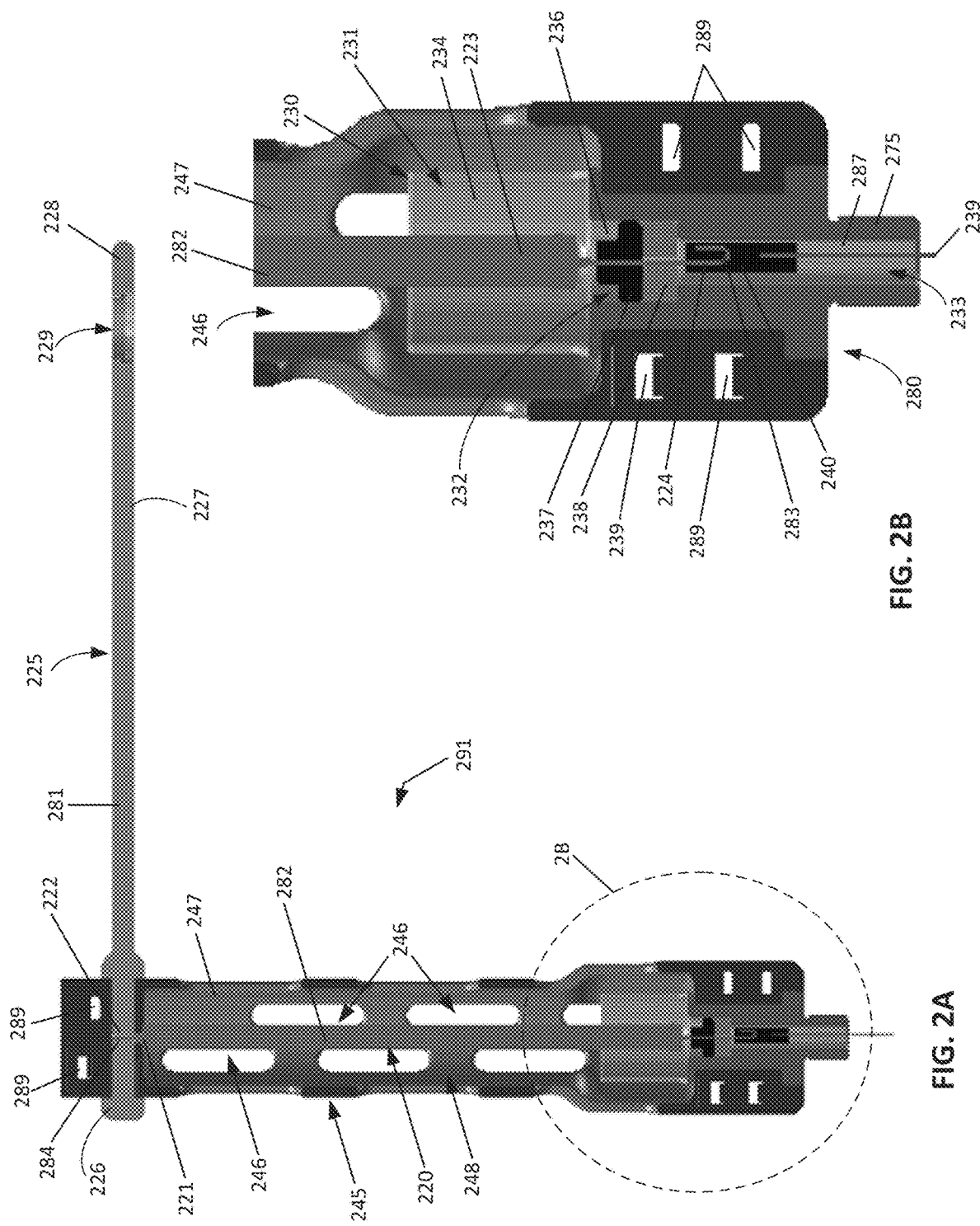

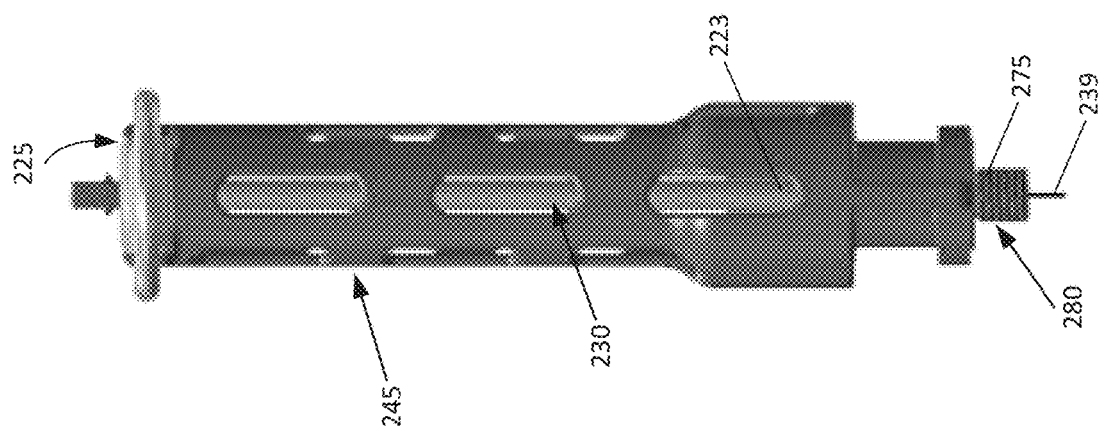
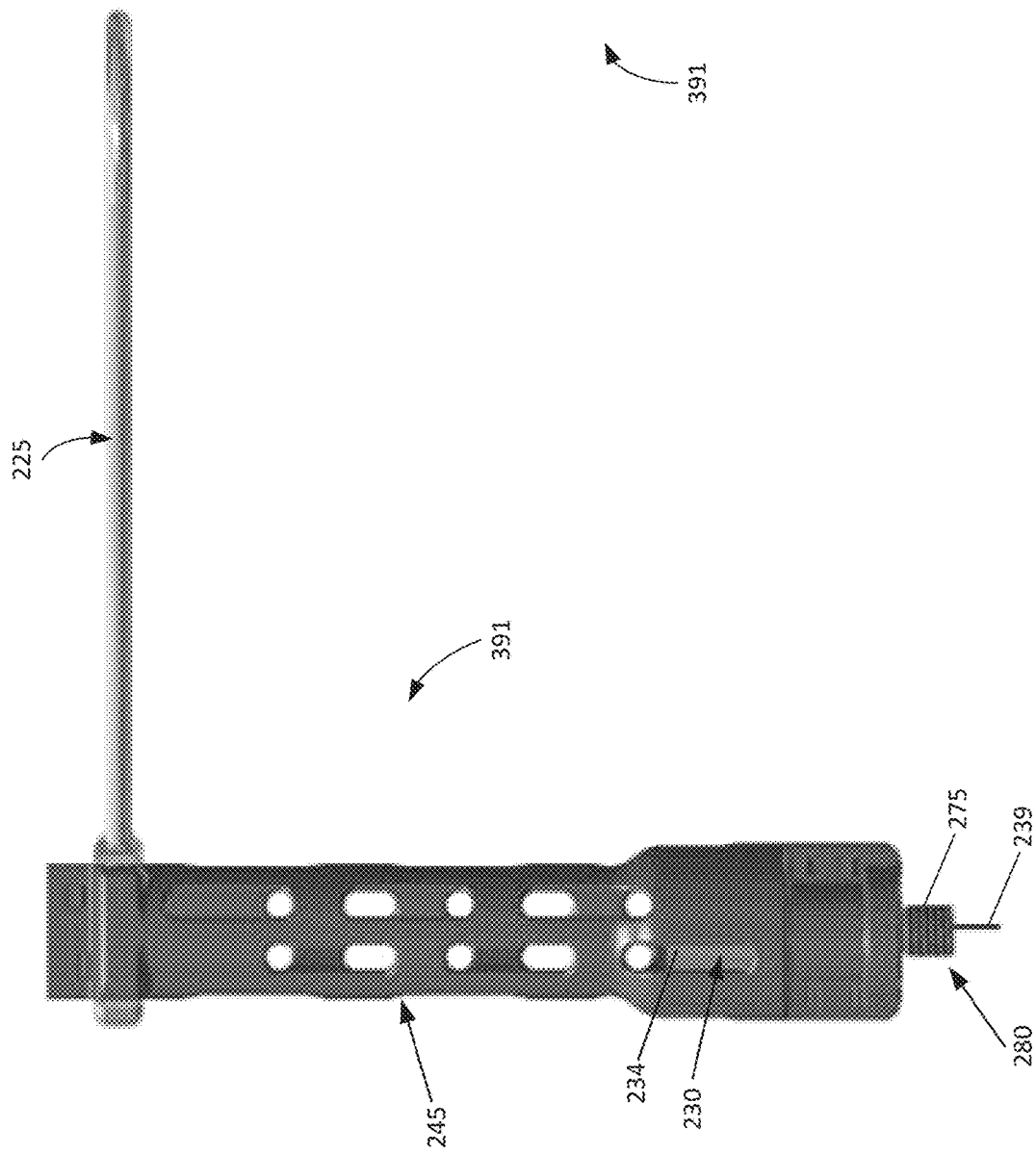
FIG. 3E
FIG. 3D

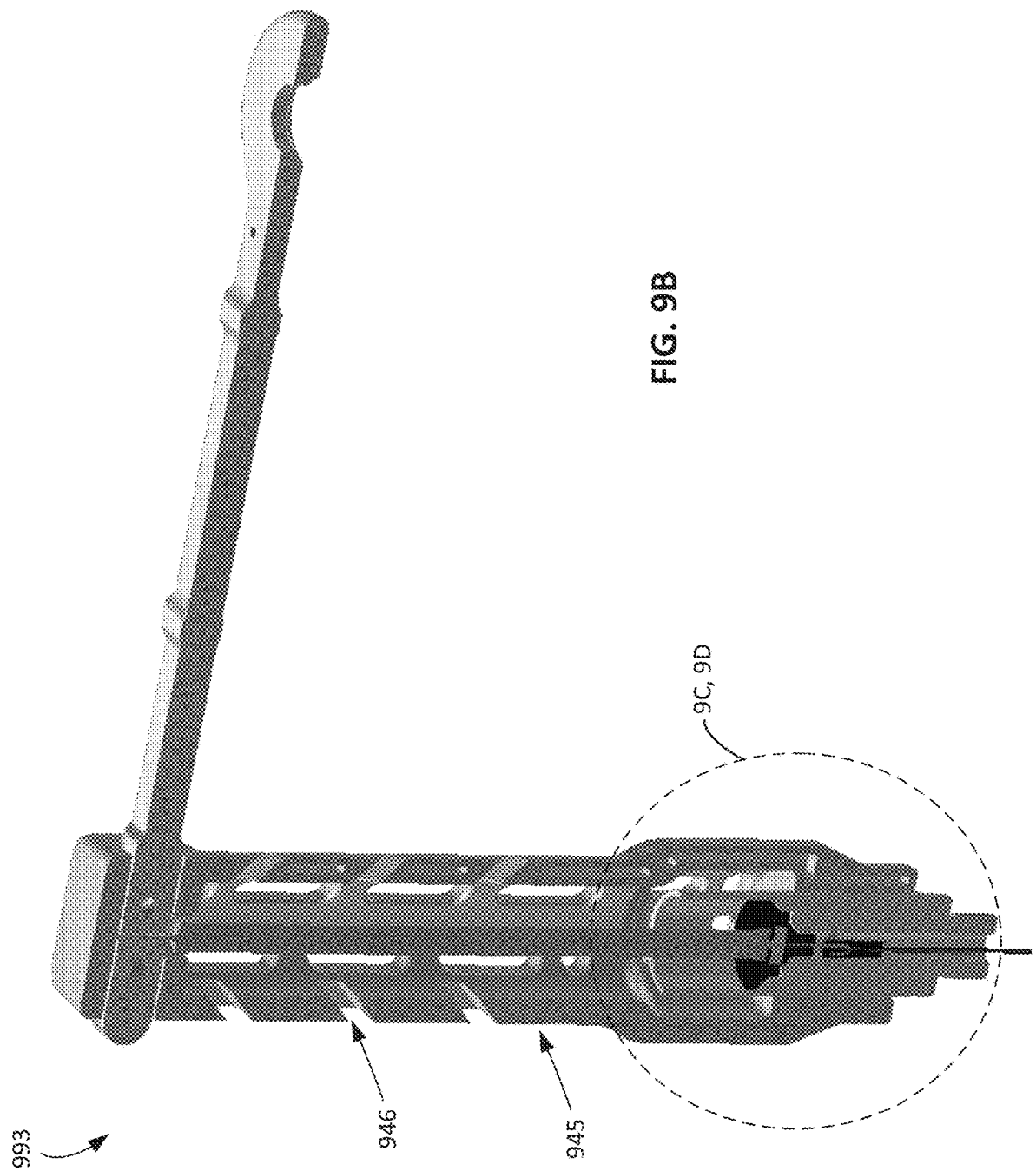

INTEGRATED VOLTAGE SENSOR

CROSS-REFERENCE TO RELATED APPLICATIONS

This application claims priority under 35 U.S.C. § 119 to U.S. Provisional Patent Application Ser. No. 62/318,172, titled "Integrated Voltage Sensor" and filed on Apr. 4, 2016, the entire contents of which are hereby incorporated herein by reference.

TECHNICAL FIELD

This description relates to a voltage sensor for an electrical apparatus, such as a recloser.

BACKGROUND

A desirable feature on an electrical apparatus is the use of voltage sensors to determine the voltage at, for example, the source or load terminals of the electrical apparatus. There is a need for an integrated voltage sensor for an electrical apparatus that provides high accuracy and reduced wire clutter.

SUMMARY

One example embodiment described here includes a resistor subassembly. The resistor subassembly may include a resistor having a first end and a second end; a conductive member, wherein the conductive member is coupled to the first end of the resistor; a shield cup; and a housing, wherein the housing includes at least one housing wall having at least one aperture, and wherein the housing encloses at least a portion of the resistor and at least a portion of the shield cup; wherein a volume of space between the at least one housing wall of the housing and the resistor is substantially filled with an insulating material and at least the outside of the housing is substantially covered with the insulating material.

Another example embodiment described here includes an electrical apparatus. The electrical apparatus may include a source terminal; a load terminal; a switching apparatus coupled to the source terminal and the load terminal; a resistor subassembly comprising a resistor having a first end and a second end; a conductive member, wherein the conductive member is coupled to the first end of the resistor; a shield cup; a housing, wherein the housing includes at least one housing wall having at least one aperture, and wherein the housing encloses at least a portion of the resistor and at least a portion of the shield cup; and a voltage detection circuit configured to detect the current from the second end of the resistor; wherein a volume of space between the at least one housing wall of the housing and the resistor is substantially filled with an insulating material and at least the outside of the housing is substantially covered with the insulating material.

Implementations may include one or more of the following features. The details of one or more implementations are set forth in the accompanying drawings and the description below. Other features will be apparent from the description and drawings, and from the claims.

DRAWING DESCRIPTION

The drawings illustrate only example embodiments and are therefore not to be considered limiting of its scope. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

FIGS. 2A and 2B show cross-sectional side views of a portion of the resistor subassembly of FIG. 1 in accordance with certain example embodiments.

FIGS. 3A-3E show various views of a portion of the resistor subassembly of FIG. 1 in accordance with certain example embodiments.

FIGS. 9A-9D show various views of another portion of a resistor subassembly in accordance with certain example embodiments.

DETAILED DESCRIPTION

Figure 1:
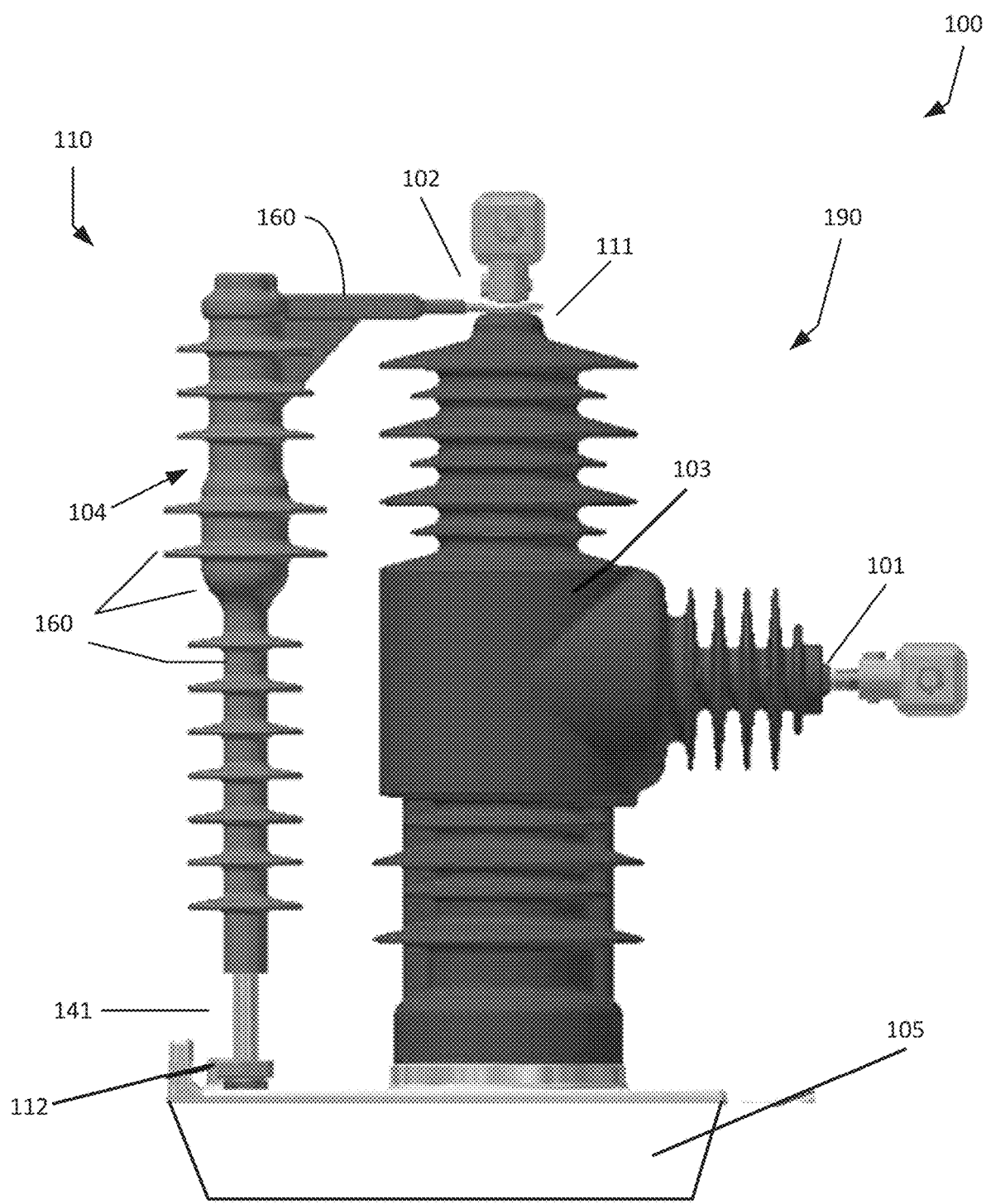
FIG. 1 is an illustration of a recloser assembly comprising an integrated load side voltage sensor having a resistor subassembly in accordance with certain example embodiments.

The example embodiments discussed herein are directed to systems, apparatuses, and methods of sensing a voltage while being integrated with some other device (e.g., a recloser) through which power may be flowing. While the figure shown and described herein are directed to reclosers, example embodiments can be use with any of a number of other types of electrical devices, including but not limited to switches, switchgear, fault interrupters, circuit breakers, transformers, and regulators. In addition, two-dimensional and three-dimensional geometric descriptions used herein are only examples and are not considered limiting. For instance, when the word "cylindrical" is used herein, this word is only used to provide one example of how a component or a volume of space can be shaped and defined. Other two-dimensional and three-dimensional geometric descriptions (e.g., rectangular, spherical, conical, circular, square), while not necessarily shown in the accompanying figures, can be used to define the shape of one or more components and/or volumes of space.

The various components of example integrated voltage sensors can be made of one or more of a number of suitable materials, including but not limited to plastic, glass, rubber, silicone, a polymer, and metal (e.g., aluminum, stainless steel, copper). An example integrated voltage sensor (or components thereof) can be part of a new installation of a new electrical device (e.g., a recloser), or can be retrofit with an existing electrical device.

In certain example embodiments, example integrated voltage sensors can be subject to meeting certain standards and/or requirements. For example, the National Electric Code (NEC), the National Electrical Manufacturers Association (NEMA), the International Electrotechnical Commission (IEC), the International Organization for Standards (ISO), and the Institute of Electrical and Electronics Engineers (IEEE) can set standards related to electrical devices and voltage sensors. Use of example embodiments described herein meet such standards when required.

Any example integrated voltage sensors, or portions thereof, described herein can be made from a single piece (e.g., as from a mold, injection mold, die cast, 3-D printing process, extrusion process, stamping process, or other prototype methods). In addition, or in the alternative, an integrated voltage sensor (or portions thereof) can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, fastening, securing, abutting, or other similar terms. Such terms are merely meant to distinguish various elements and/or features within a component or device and are not meant to limit the capability or function of that particular element and/or feature. For example, a feature described as a "coupling feature" can couple, secure, fasten, abut, and/or perform other functions aside from merely coupling.

A coupling feature (including a complementary coupling feature) as described herein can allow one or more components and/or portions of an integrated voltage sensor to become coupled, directly or indirectly, to another portion of the integrated voltage sensor and/or an electrical device (e.g., a recloser). A coupling feature can include, but is not limited to, a clamp, a portion of a hinge, an aperture, a recessed area, a protrusion, a hole, a slot, a tab, a detent, and mating threads. One portion of an example integrated voltage sensor can be coupled to an electrical device by the direct use of one or more coupling features.

In addition, or in the alternative, a portion of an example integrated voltage sensor can be coupled to another portion of the integrated voltage sensor and/or an electrical device using one or more independent devices that interact with one or more coupling features disposed on a component of the integrated voltage sensor. Examples of such devices can include, but are not limited to, a pin, a hinge, a fastening device (e.g., a bolt, a screw, a rivet), epoxy, glue, adhesive, and a spring. One coupling feature described herein can be the same as, or different than, one or more other coupling features described herein. A complementary coupling feature as described herein can be a coupling feature that mechanically couples, directly or indirectly, with another coupling feature.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein. The numbering scheme for the various components in the figures herein is such that each component is a three digit number and corresponding components in other figures have the identical last two digits.

As described herein, a user can be any person that interacts with a voltage sensor used with an electrical device. Examples of a user may include, but are not limited to, a consumer, an electrician, an engineer, a mechanic, a consultant, a contractor, a lineman, and a manufacturer's representative. In one or more embodiments, one or more of the components shown in the following figures may be omitted, added, repeated, and/or substituted. Accordingly, embodiments of integrated voltage sensors should not be considered limited to the specific arrangements of components shown in such figures.

Example embodiments of integrated voltage sensors will be described more fully hereinafter with reference to the accompanying drawings, in which example embodiments of integrated voltage sensors are shown. Integrated voltage sensors may, however, be embodied in many different forms and should not be construed as limited to the example embodiments set forth herein. Rather, these example embodiments are provided so that this disclosure will be thorough and complete, and will fully convey the scope of integrated voltage sensors to those of ordinary skill in the art. Like, but not necessarily the same, elements (also sometimes called components) in the various figures are denoted by like reference numerals for consistency.

Terms such as "first", "second", "length", "width", "height", "distal", "proximal", "top", "bottom", "side", "end", "left", and "right" are used merely to distinguish one component (or part of a component or state of a component) from another. Such terms are not meant to denote a preference or a particular orientation, and are not meant to limit embodiments of integrated voltage sensors. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 is a recloser assembly 100 that includes a recloser 190 and an integrated load side voltage sensor 110. The recloser 190 of the recloser assembly 100 of FIG. 1 includes a source terminal 101, a load terminal 102, a switching apparatus 103 (e.g., a vacuum switching apparatus 103), and a resistor subassembly 104. An example vacuum switching apparatus 103 is described in U.S. Pat. No. 7,854,058, which is incorporated by reference herein in its entirety. The vacuum switching apparatus 103 may include a tank 105 that houses components for the vacuum switching apparatus 103 and/or its controls. In an example embodiment, voltage is provided at the source terminal 101 and, when the vacuum switching apparatus 103 is in a closed position, may extend through the vacuum switching apparatus 103 to the load terminal 102. Conversely, in such a case, when the vacuum switching apparatus 103 is in an open position, there is an open circuit between the source terminal 101 and the load terminal 102. In other embodiments, the voltages at the source terminal 101 and the load terminal 102 may differ.

The example integrated load side voltage sensor 110 of the recloser assembly 100 of FIG. 1 includes one or more of a number of components and/or subassemblies. For example, as shown in FIG. 1, the integrated load side voltage sensor 110 includes the resistor subassembly 104 and a conductive tube 141. The integrated load side voltage sensor 110 is coupled to the recloser 190. Specifically, a first end 111 of the integrated load side voltage sensor 110 connects to the load terminal 102, and a second end 112 of the integrated load side voltage sensor 110 connects to the recloser 190 at the tank 105. The integrated load side voltage sensor 110, using the resistor subassembly 104, draws a current that is used to sense the voltage at the load terminal 102 of the recloser 190. Many of the components of the integrated load side voltage sensor 110 are hidden from view by the insulating material 160, which electrically insulates those components from the external environment. More details of these components of the integrated load side voltage sensor 110 are provided with respect to the figures below.

FIGS. 2A and 2B show cross-sectional side views of a portion 291 of a resistor subassembly 104 in accordance with an example embodiment. Specifically, FIG. 2A shows a cross-sectional side view of the portion 291, and FIG. 2B shows a detailed cross-sectional side view of the bottom of the portion 291. Referring to FIGS. 1-2B, the portion 291 of the resistor subassembly 104 of FIG. 1 includes a resistor 220 having a body 282, a first end 221 of the body 282 having a first lead 222, and a second end 223 of the body 282 having a second lead 224. The resistor 220 can be made of one or more of a number of materials (e.g., aluminum, copper, ceramic), at least some of which are electrically conductive. For example, the resistor 220 can be principally made of ceramic with electrically-conductive traces (e.g., of copper or aluminum) printed on it. The portion 291 of FIGS. 2A and 2B also includes a conductive member 225 (also sometimes called an electrically conductive member 225) having a body 281, a first end 226 of the body 281 having a coupling feature 284, and a second end 227 of the body 281 having a termination 228 with a coupling feature 229. The conductive member 225 can be considered part of the resistor subassembly 104. Alternatively, the conductive member 225 can be a separate component that is coupled to the resistor subassembly 104.

The first lead 222 of the resistor 220 can be coupled to the coupling feature 284 of the first end 226 of conductive member 225 in one or more of any of a number of ways. For example, the coupling feature 284 can be a receptacle that is disposed (e.g., by a press fitting) within the first end 226 of the conductive member 225, and the first lead 222 of the resistor 220 can be coupled to the coupling feature 284 of the first end 226 by plugging the first lead 222 into the coupling feature 284 of the conductive member 225. In such a case, the first lead 222 can be allowed to move within the overmolded insulating material without breaking. One or more additional coupling features (e.g., barbs) can be part of the coupling feature 284 at the first end 226 of the conductive member 225 and/or the first lead 222 of the resistor 220 to secure an electrical connection between the coupling feature 284 at the first end 226 of the conductive member 225 and the first lead 222 of the first end 221 of the resistor 220. In addition, or in the alternative, the first end 226 of the conductive member 225 and/or the first lead 222 of the resistor 220 can include one or more of a number of other coupling features (e.g., malleability for crimping, mating threads, compression fittings, apertures to receive fastening devices) to secure an electrical connection between the first end 226 of the conductive member 225 and the first lead 222 of the first end 221 of the resistor 220.

In certain example embodiments, the resistor 220 and the conductive member 225 can be arranged at some non-zero angle relative to each other. For example, as shown in FIG. 2A, the resistor 220 and the conductive member 225 can be arranged substantially perpendicular to one another. The second end 227 of the conductive member 225 can be coupled to an electrical device (in this case, the recloser 190) at a point for which a voltage reading is desired. For example, in this case, as shown in FIG. 1, the second end 227 of the conductive member 225 is coupled to the load terminal 102 of the vacuum switching apparatus 103 of the recloser 190.

As discussed above, the second end 227 of the conductive member 225 includes a termination 228 having a coupling feature 229, which in this case is an aperture extending through the termination 228. The termination 228 can have any of a number of shapes (in this case, circular) when viewed from above. The termination 228 can act as a corona ring to reduce insulation degradation due to electrical stress. The conductive member 225 can be made from one or more of any of a number of electrically conductive materials, including but not limited to aluminum, stainless steel, and copper.

The portion 291 of the resistor subassembly 104 shown in FIGS. 2A and 2B also includes a shield cup 280 (also sometimes referred to as a lower coupler 280 or a shielding cup 280) disposed at the second end 223 of the resistor 220. Alternatively, the shield cup 280 can be a separate component from the resistor subassembly 204 that is disposed at the second end 223 of the resistor 220. The bottom end of the shield cup 280 includes a coupling feature 275 (in this case, mating threads) for coupling the shield cup 280 to the conductive tube 141. In certain example embodiments, the shield cup 280 is at least partially positioned within the housing 245 (discussed below) of the resistor subassembly 104. Alternatively, the shield cup 280 can be disposed completely outside the housing 245 of the resistor subassembly 104.

In certain example embodiments, the shield cup 280 includes one or more of a number of components. For example, as shown in FIGS. 2A and 2B, the shield cup 280 can include a conductive shield component 230 (also sometimes called an electrically conductive shield component 230, a conductive shielding component 230, or simply a shield component 230). The shield component 230 can have one or more walls that form one or more volumes of space. For example, as shown in FIGS. 2A and 2B, the shield component 230 has three walls that form three volumes of space that are continuous with each other. Specifically, as shown in FIG. 2B, the shield component 230 has an upper portion with a wall 234 that forms a first cylindrical volume of space 231 having a first circumference. Directly under the first cylindrical volume of space 231, a wall 236 forms a second cylindrical volume of space 232 having a second circumference. Directly under the second cylindrical volume of space 232, representing the lower portion of the shield component 230, a wall 287 forms a third cylindrical volume 233 having a third circumference.

In certain example embodiments, the size of one circumference (in this case, the first circumference, the second circumference, and the third circumference) can be larger, smaller, or the same as the size of one or more other circumferences formed by the one or more walls (e.g., wall 234, wall 236, wall 287) of the shield component 230. For example, the first circumference can be larger than the second circumference. Alternatively, the first cylindrical volume of space 231 and second cylindrical volume of space 232 have equal circumferences and appear as a single cylindrical volume of space. Similarly, the height of one wall of the shield component 230 can be larger, smaller, or substantially the same as the height of one or more other walls of the shield component 230.

As discussed above, in certain example embodiments, the conductive shield component 230 is positioned at least partially within the housing 245. The second end 223 of the resistor 220 can be at least partially enclosed by the first cylindrical wall 234 defining the first cylindrical volume of space 231 of the conductive shield component 230, which provides electrical shielding of at least a portion of the resistor 220 and the second lead 224 of the resistor 220. In certain example embodiments, a vacuum interrupter of the vacuum switching apparatus 103 of the recloser 190 is structured to be positioned in parallel to the resistor 220, which can induce additional capacitive current to flow through the resistor 220, resulting in reduced accuracy of the load side voltage sensor 110. The electrical shielding provided by the conductive shield component 230 can reduce the effect of such induced current through the resistor 220 and second lead 224 of the resistor 220.

One or more of the volumes of space of the shield component 230 can be filled with an electrically insulating material (e.g., insulating material 160). One or more of the walls of the shield component 230 can include one or more of a number of features allowing such insulating material to be supplied into one or more volumes of space of the shield component 230, for example during an overmolding process, to more easily fill the volume(s) of space. For example, as shown in FIGS. 3A-3E below, one or more walls of the shield component 230 can include one or more apertures 350 (in this case, slots) to allow electrically insulating material 160 supplied during an overmolding process to more easily fill one or more of the volumes of space.

In certain example embodiments, one or more plugs 237 can be disposed within a volume of space of the shield component 230. For example, in this case, a plug 237 is sized and shaped to fit within the second cylindrical volume of space 232 of the conductive shielding component 230. The plug 237 creates a seal to prevent electrically insulating material 160 from traversing the plug 237 to enter another volume of space within the shield component 230. For example, the plug 237 can be positioned in the second volume of space 232 to prevent insulting material 160 from entering the third cylindrical volume of space 233 during the overmolding process.

In certain example embodiments, one or more electrically insulating washers 238 (also called insulating washers 238 or washers 238) can be disposed within a volume of space of the shield component 230. For example, in this case, an electrically insulating washer 238 is located within the second cylindrical volume of space 232 between the plug 237 and the third cylindrical volume of space 233. An electrically insulating washer 238 can provide mechanical support for the plug 237 during the overmolding process. The insulating washer 238 can be made of one or more of any number of materials, including but not limited to glass-filled nylon and thermoset plastic. The overmolding process places pressure on the plug 237, and without the support from the insulating washer 238, the plug 237 may be forced into the third cylindrical volume of space 233. The combination of the plug 237 and the insulating washer 238 form a sealing means.

Additionally, or alternatively, other components and/or mechanisms (e.g., a damming device) can be used to provide a solid seal in a volume of space within the shield component 230. The combination of the plug 237, the washer 238, and/or any other such components and/or mechanisms can be referred to herein as a sealing device. In any case, the sealing device (in this case, the plug 237 and the insulating washer 238) have an opening to allow passage of the second lead 224 (as shown in FIGS. 2A and 2B) of the resistor 220 or the wire 239 (described below) therethrough while still preventing a fluid in a volume of space on one side of the seal device from entering a volume of space on the other side of the seal device.

The third cylindrical volume of space 233 provides a passage for the wire 239 carrying the current from the second lead 224 of the resistor 220. The second lead 224 of the resistor 220 is coupled to wire 239 by a coupling feature 283 (e.g., solder). In certain example embodiments, the point of connection between the second lead 224 of the resistor 220 and the wire 239 is enclosed in a protective material 240 (e.g., shrink wrap, electrical tape) to help secure the point of connection and/or to prevent the point of connection from being exposed to contaminants. The wire 239 extends out of the conductive shield component 230 and into the conductive tube 141, which is mechanically coupled to the bottom end of the shield cup 280 using the coupling feature 275.

In certain example embodiments, the conductive tube 141 shields the wire 239 from electrically induced current, and also provides a physical mounting base for at least a portion of the integrated load side voltage sensor 110. In certain example embodiments, the wire 239 carries the current to a voltage detection circuit (not shown) of a recloser control, which uses the current to calculate voltage according to methods known to those of ordinary skill in the art. In other example embodiments, the voltage detection circuit may be positioned in other places, such as the tank of the vacuum switching apparatus. The voltage detection circuit may include hardware or a combination of hardware and software.

In certain embodiments, a portion of the resistor subassembly 104, including the resistor 220 and at least a portion of the conductive shield component 230, is at least partially enclosed by the housing 245. The housing 245 provides mechanical support for the resistor 220 for the overmolding process. The housing 245 also can provide mechanical strength to reduce the likelihood of breaking the resistor 220 when force is applied. In this way, the housing 245 serves as an exoskeleton for the resistor 220 and the insulting material 160 that is injected to surround the resistor 220, as well as an endoskeleton for additional insulating material 160 that is overmolded on the housing 245.

Figure 9A:
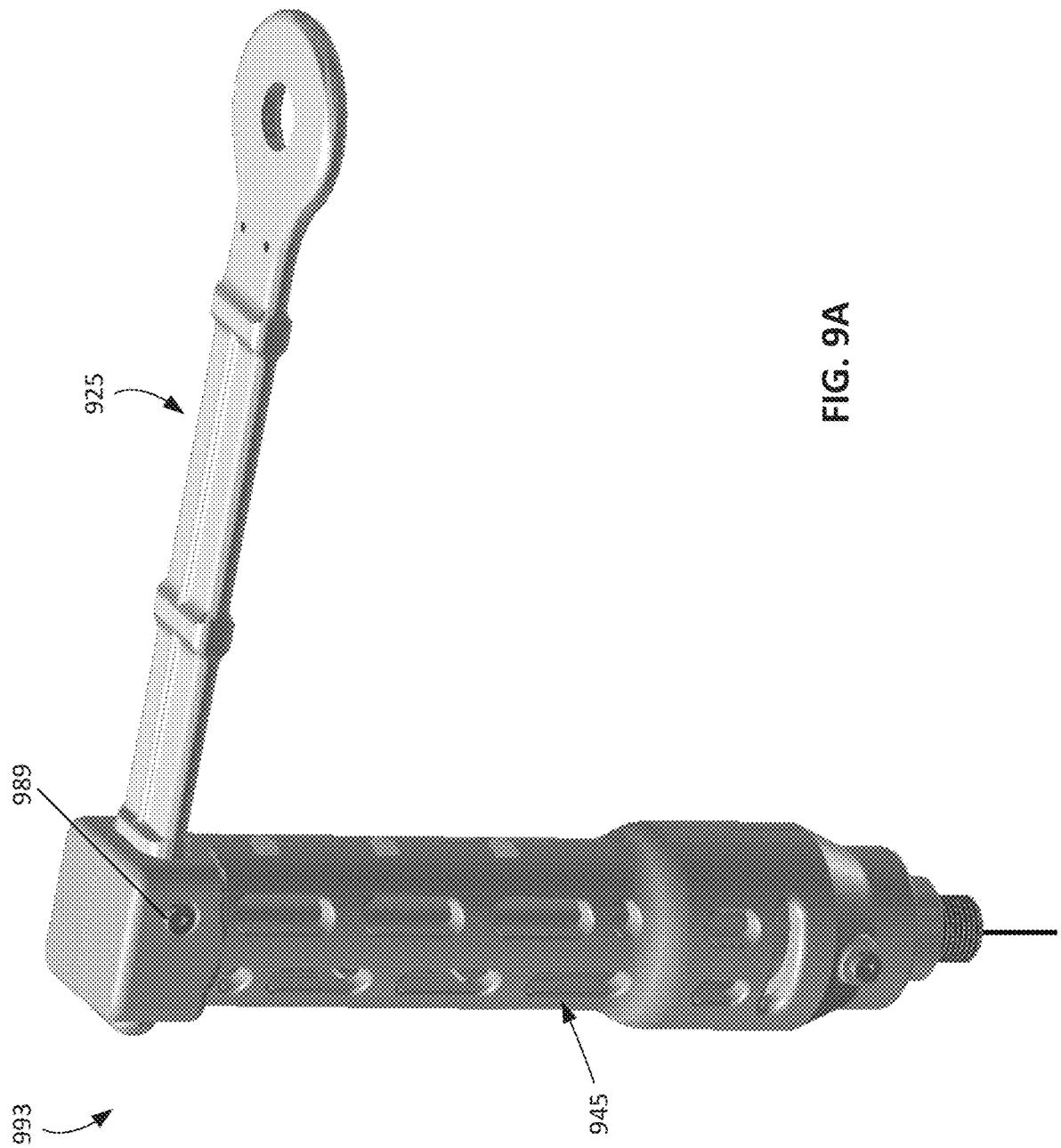

The housing 245 can be made of one or more of any number of materials (e.g., thermosets, thermoplastics) that are capable of withstanding high pressures and temperatures associated with the overmolding process. The housing 245 can include one or more walls 247 that form a volume of space 248. In certain example embodiments, the one or more walls 247 have one or more apertures 246 that traverse therethrough. Such apertures 246 can allow the insulating material 160 to flow into the air gaps of the volume of space 248 (in this case, cylindrical) of the housing 245 during the overmolding process. In certain example embodiments, the housing 245 is manufactured in multiple (e.g., two, four) parts that are joined to form the complete housing using one or more coupling features 289. In this case, the coupling features 289 include a number of snaps that latch into a number of corresponding apertures to lock the multiple pieces of the housing 245 together. FIGS. 9A and 9B below show how the coupling features 289 can include apertures and fastening devices for coupling the multiple pieces of the housing together.

At least a portion of the resistor subassembly 104 is overmolded with an electrically insulating material 160, which may be a rubber material such as silicone, EPDM, or a combination of the two. As an alternative, the electrically insulating material 160 can be injection molded from a solid log of visco-elastic material such as high consistency rubber (HCR) vinyl-methyl silicone. The insulating material 160 fills the volume of space 248 within the housing 245 to prevent electrical arcing events between components of the resistor subassembly 104. This electrically insulating material 160 can also be injected into at least some of the volume of space (e.g., volume of space 231, the portion of the volume of space 232 located above the plug 237) of the shield component 230. In addition, one or more sheds (e.g., protrusions), while not shown in FIGS. 2A and 2B, can be disposed along some or all of an outer perimeter of the housing 245.

Figure 3A:
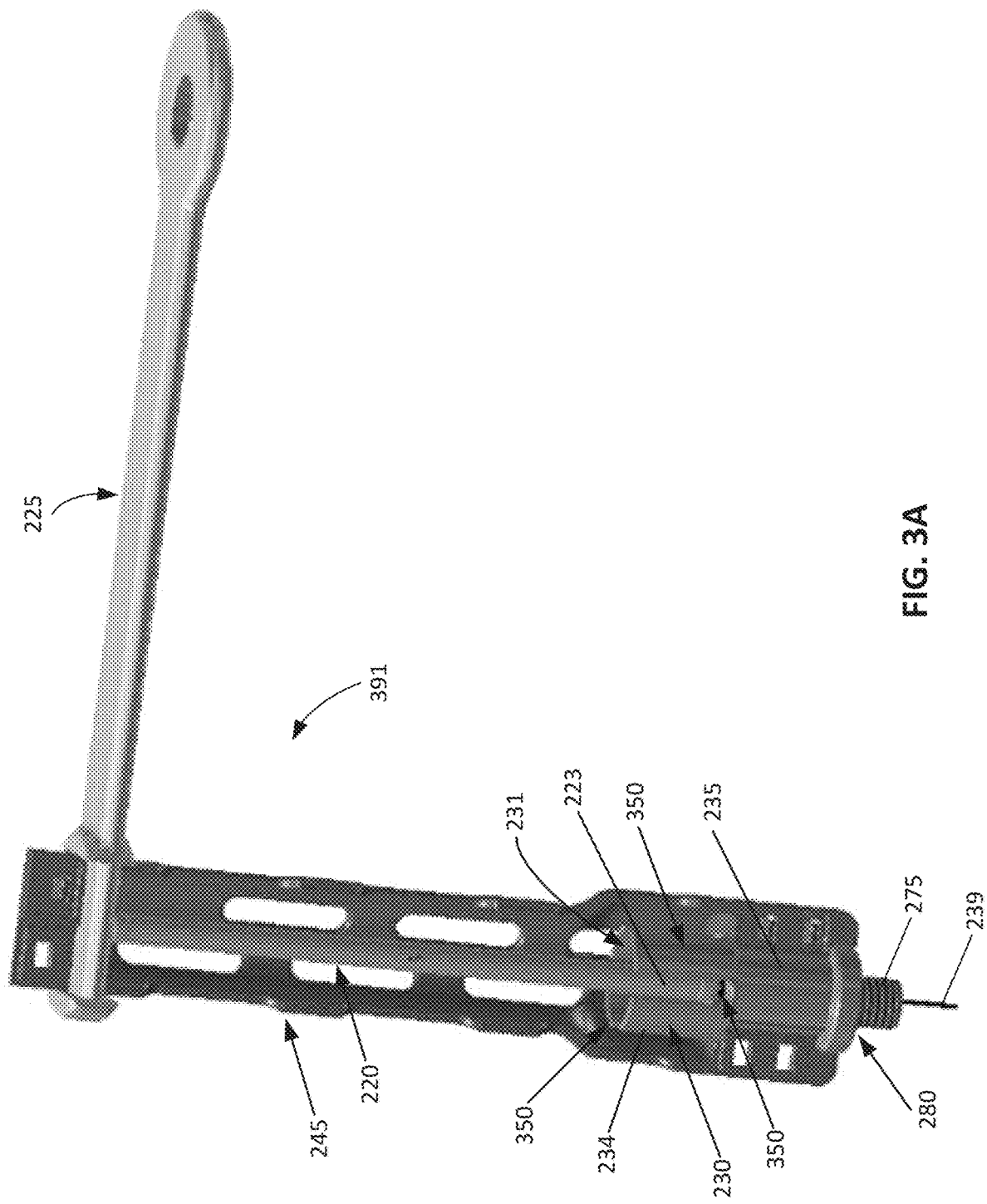
Figure 3C:
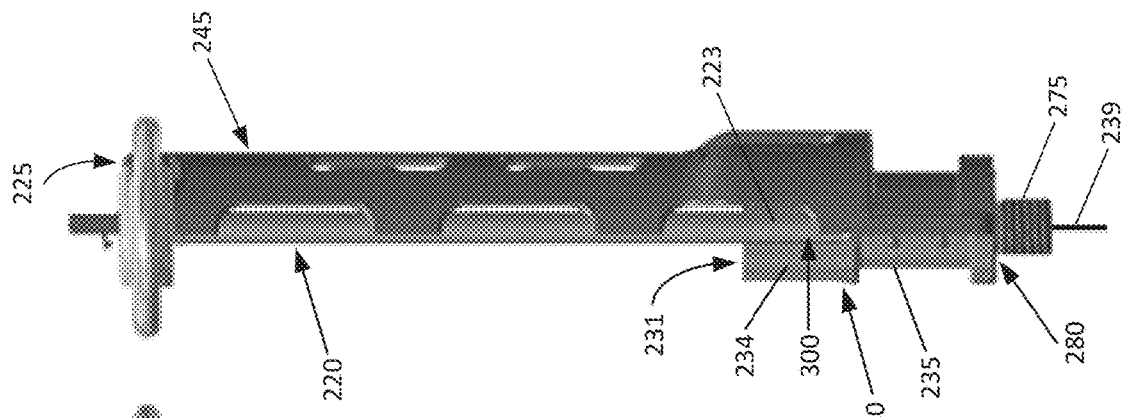
Figure 3B:
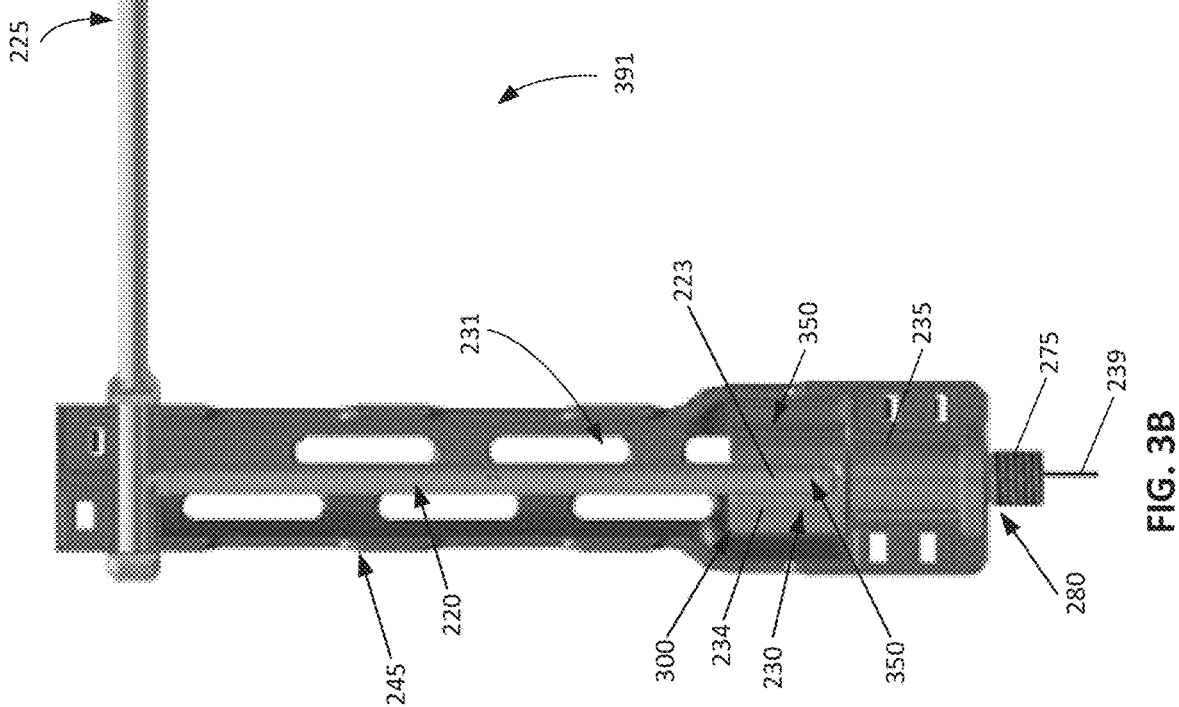

FIGS. 3A-3E show various views of the portion 391 of the resistor subassembly 104 shown in FIGS. 2A and 2B, except that in this case, none of the components in the portion 391 of FIGS. 3A-3E are in cross section. Specifically, FIG. 3A shows a top-side perspective view of the portion 391 of the resistor subassembly 104. FIG. 3B shows a side view of the portion 391 of the resistor subassembly 104. FIG. 3C shows a front view of the portion 391 of the resistor subassembly 104. FIG. 3D shows a side view of the portion 391 of the resistor subassembly 104. FIG. 3E shows a front view of the portion 391 of the resistor subassembly 104. In FIGS. 3A-3C, only one of the two pieces that couple to each other to make up the housing 245 is shown, giving the housing 245 a cross-sectional appearance in FIGS. 3A-3C.

Referring to FIGS. 1-3E, the second end 223 of the resistor 220 is shown disposed within the housing 245. The coupling feature 275 at the bottom of the shield cup 280 is shown, as well as the wire 239 exiting the bottom of the shield cup 280. The shield component 230 of the shield cup 280 shows the wall 234 that defines the volume of space 231 at the top end of the shield component 230. Also shown disposed in the wall 234 are one or more (in this case, four) apertures 350 (in this case, U-shaped slots) that traverse the wall 234. As discussed above, these apertures 350 can be used to allow electrically insulating material 160 supplied during an overmolding process to more easily fill one or more of the volumes of space (e.g., volume of space 231). While four apertures 350 are shown in the first cylindrical wall 234 of the conductive shield component 230 in this example, any number or shape of apertures 350 may be used in any of the walls of the shield component 230.

Figure 4:
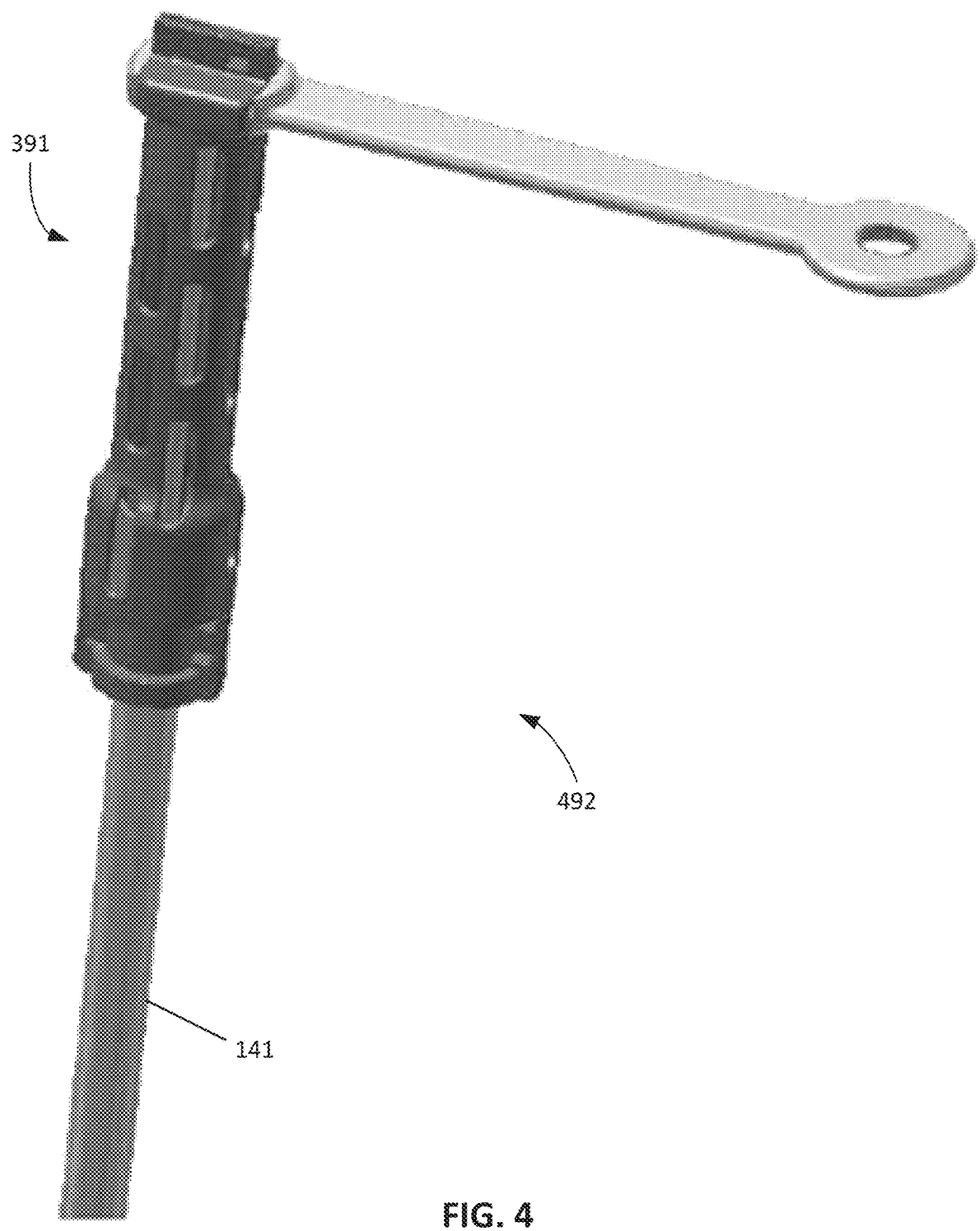
FIG. 4 is an isometric view of a portion of the resistor subassembly of FIG. 1 in accordance with certain example embodiments.

FIG. 4 is an isometric view of a portion 492 of the resistor subassembly 104 in accordance with certain example embodiments. Referring to FIGS. 1-4, the portion 492 shown in FIG. 4 includes the portion 391 of FIGS. 3D and 3E with the conductive tube 141 coupled to the portion 391 using the coupling feature 275 (hidden from view in FIG. 4).

Figure 5A:
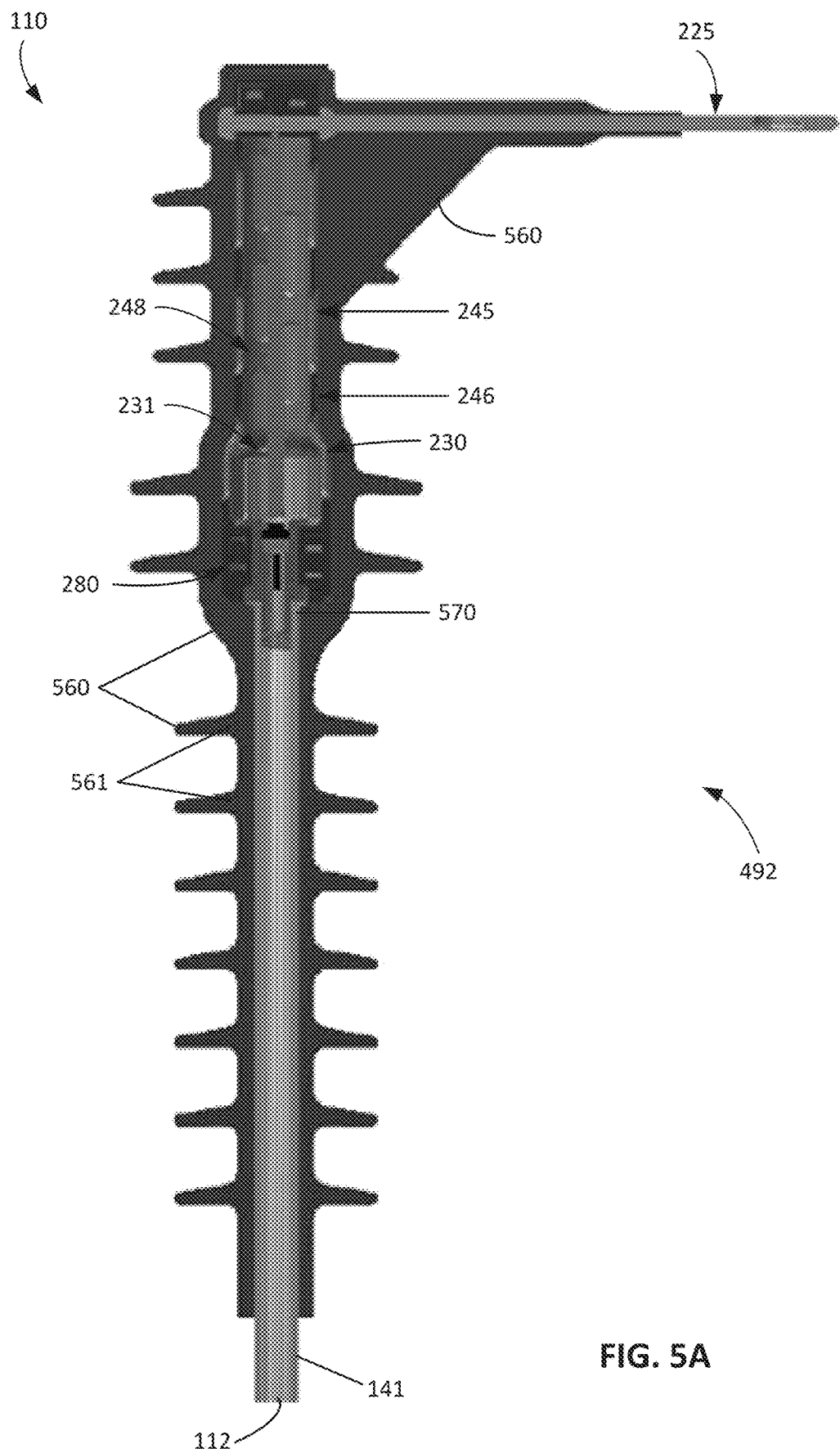
FIGS. 5A-5C show various views of the integrated load side voltage sensor in accordance with certain example embodiments.
Figure 5B:
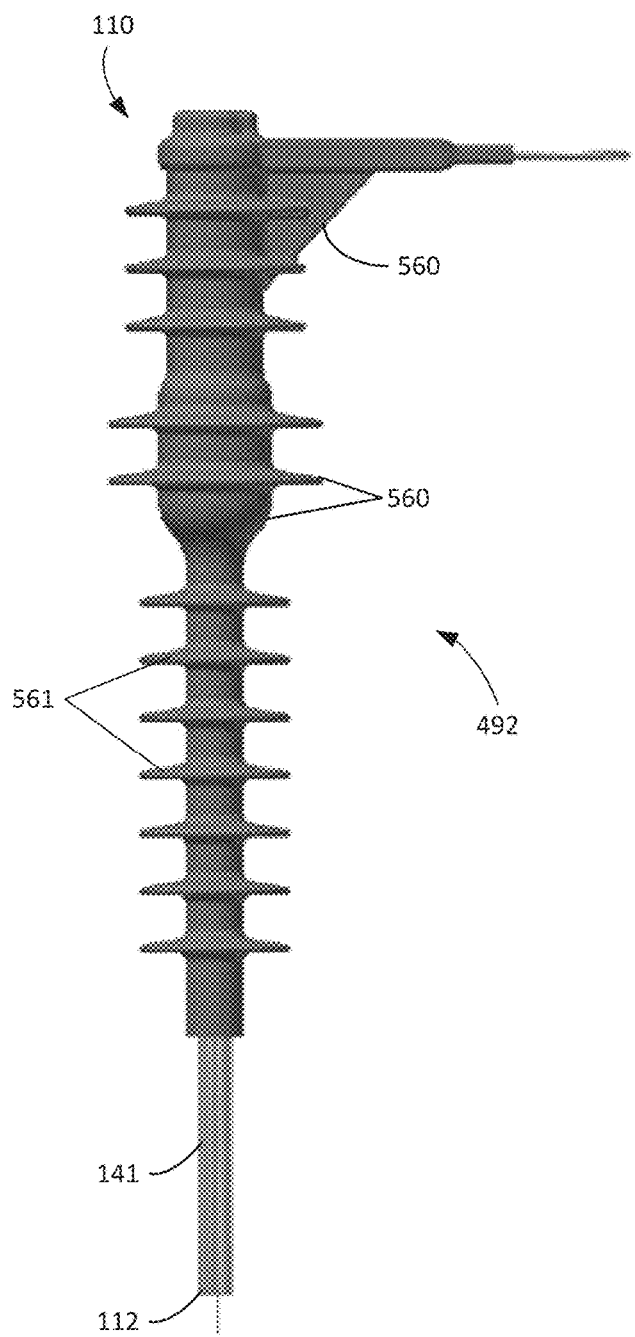
Figure 5C:
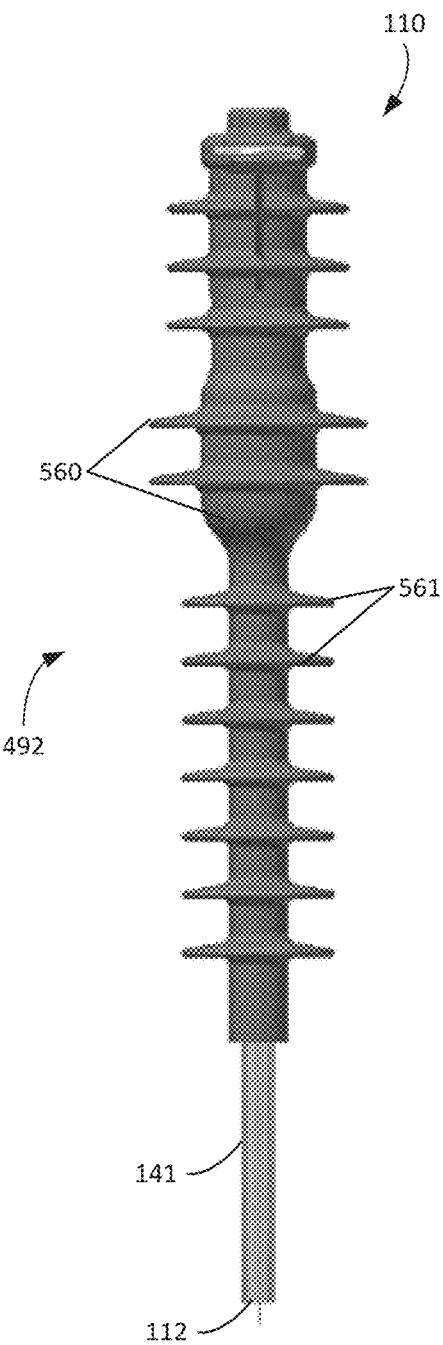

FIGS. 5A-5C show various views of the integrated load side voltage sensor 110 in accordance with certain example embodiments. Specifically, FIG. 5A shows a cross-sectional side view (with the insulating material 160 removed from view) of the integrated load side voltage sensor 110. FIG. 5B shows a side view of the integrated load side voltage sensor 110. FIG. 5C shows a front view of the integrated load side voltage sensor 110. FIGS. 5A-5C show the portion 492 of the resistor subassembly 104 of FIG. 4 after it has undergone at least one overmolding process.

Referring to FIGS. 1-5C, during the overmolding process (e.g., a first stage of the overmolding process), the insulating material 560 flows through the apertures 246 of the housing 245 to fill the volume of space 248 of the housing 245. The insulating material 560 also fills the first cylindrical volume of space 231 of the conductive shield component 230 of the shield cup 280. A first end 570 of the conductive tube 141 is connected to the conductive shield component 230, and a second end 112 of the conductive tube 141 (equivalent to the second end 112 of the integrated load side voltage sensor 110) can be connected to the tank 105 (not shown in FIGS. 5A-5C) of the recloser 190 (also not shown in FIGS. 5A-5C). The conductive shield component 230 is grounded through its connection to the conductive tube 141 and the tank 105 of the recloser 190, thus reducing induced current from the vacuum interrupter of the vacuum switching apparatus 103 or other electrical components in the system.

In certain example embodiments, the insulating material 560 covers at least most of the portion 492 of resistor subassembly 104, including housing 245, and portions of the conductive tube 141 and conductive member 225. The insulating material 560 may also form circumferential sheds 561 along some or all of the length of the housing 245 and/or the conductive tube 141.

Figure 6:
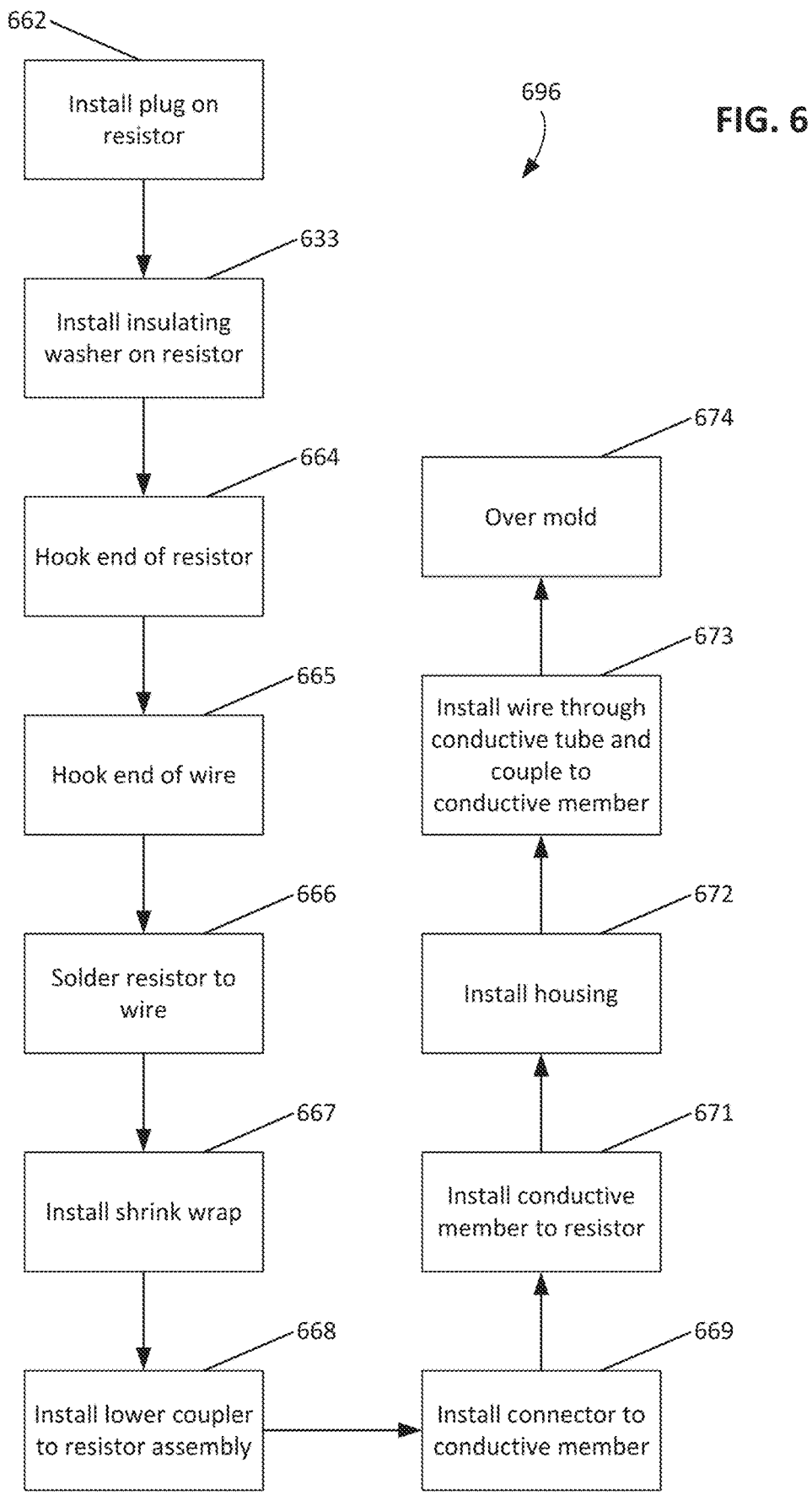
FIG. 6 is a flowchart illustrating methods for making a resistor subassembly in accordance with certain example embodiments.

FIG. 6 is a flowchart illustrating a method 696 for making an integrated load side voltage sensor (e.g., integrated load side voltage sensor 110) in accordance with certain example embodiments. While the various steps in this flowchart are presented sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order. In addition, a person of ordinary skill in the art will appreciate that additional steps not shown in FIG. 6 may be included in performing this method 696. Accordingly, the specific arrangement of steps should not be construed as limiting the scope.

Referring to FIGS. 1-6, the method 696 of FIG. 6 starts at step 662, where the plug 237 is first installed on the second lead 224 of the resistor 220. This can be accomplished, for example, by inserting the second lead 224 through a hole in the plug 237. In step 663, the insulating washer 238 is installed on the second lead 224 of the resistor 220. In step 664, the second lead 224 of the resistor 220 is then manipulated into a hook shape. In step 665, the wire 239 is also manipulated into a hook shape at the end that couples to the second lead 224 of the resistor 220. In step 666, the second lead 224 and the wire 239 are connected and soldered together. In step 667, shrink wrap 240 is then installed over the solder joint.

In step 668, the conductive shield component 230 is installed so that the second end 223 of the resistor 220 is at least partially enclosed by the first cylindrical wall 234 defining the first cylindrical volume of space 231 of the conductive shield component 230. The plug 237 and the insulating washer 238 are disposed within and enclosed by the second cylindrical wall 236 defining the second cylindrical volume of space 232 of the conductive shield component 230.

In step 669, a connector (e.g., coupling feature 284) is installed in the first end 226 of the conductive member 225. In step 671, the first lead 222 of the resistor 220 is inserted into the connector (e.g., coupling feature 284) of the conductive member 225, as described in step 669 above. In step 672, the housing 245 is then installed over the resistor 220 to enclose the resistor 220. In an example embodiment, this may be done by snapping together two pieces of the housing 245 in a clam shell design. In another embodiment, as shown in FIGS. 9A-9D below, this may be done by screwing the two parts of the housing 245 into threaded holes in the conductive shield component 230, in the conductive member 225, and/or other parts of the housing 245.

In step 673, the wire 239 is installed through the conductive tube 141, and the conductive tube 141 is coupled to the conductive shield component 230. In an example embodiment, conductive tube 141 is installed to conductive shield component 230 by using a threaded coupling mechanism 275, but other techniques may be used.

In step 674, the portion 492 of the resistor subassembly 104 is overmolded with an insulating material 560. The insulating material 560 can substantially fill the volumes of space 248 of the housing 245 and the first cylindrical volume of space 231 of the conductive shield component 230, removing any air within those volumes of space. The insulating material 560 can fill the volumes of space by moving through the apertures 246 in the housing 245. The insulating material 560 may cover the housing 245 and portions of the conductive member 225 and conductive tube 141. The insulating material 560 can be overmolded into and onto the portion 492 of the resistor subassembly 104, the conductive member 225, and/or the conductive tube 141 in a single stage or in multiple stages.

Figure 7:
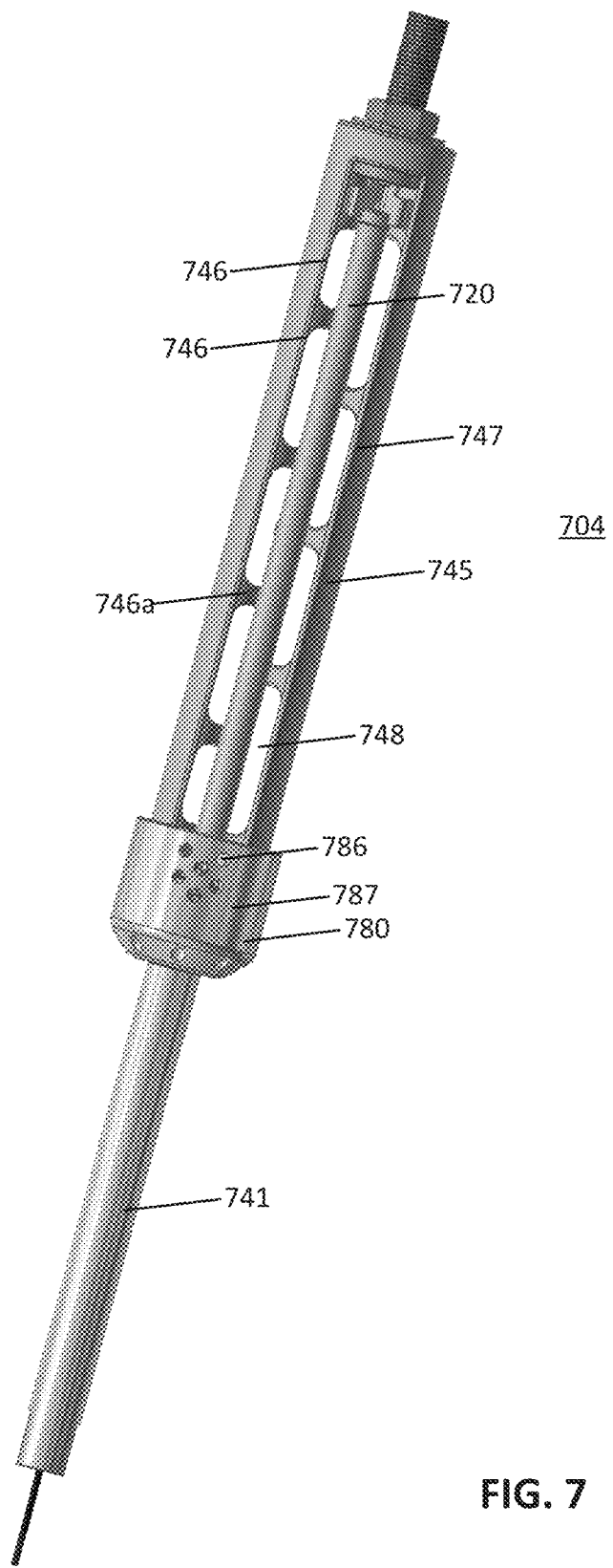
FIG. 7 is a side view of a portion of another resistor subassembly in accordance with certain example embodiments.

FIG. 7 is a side view of a portion of another resistor subassembly in accordance with certain example embodiments. Referring to FIGS. 1-7, the housing 745 of FIG. 7 encloses the resistor 720. The housing 745 includes at least one aperture 746, and preferably a plurality of apertures 746, in its wall 747 to allow insulating material to flow into the air gaps of the volume of space 748 of the housing 745 during the overmolding process. The housing 745 includes an aperture 746a that spans substantially the entire length of the housing 745 in addition to the shorter apertures 746. In this embodiment, the housing 745 is manufactured as a single piece.

The resistor subassembly 704 of FIG. 7 includes a shield cup 780 positioned on the outside of and surrounding a portion of the housing 745. The shield cup 780 can include one or more apertures 786 (e.g., holes, slots) that allow insulating material to flow into the air gaps of the volume of space 748 of the housing 745 and the volume of space 787 of the shield cup 780 during the overmolding process.

The conductive tube 741 can couple to the shield cup 780 using a threaded mating connection (not shown). As the conductive tube 741 is rotated to mate the conductive tube 741 with the shield cup 780, the shield cup 780 is pressed into place against the housing 745.

Figure 8:
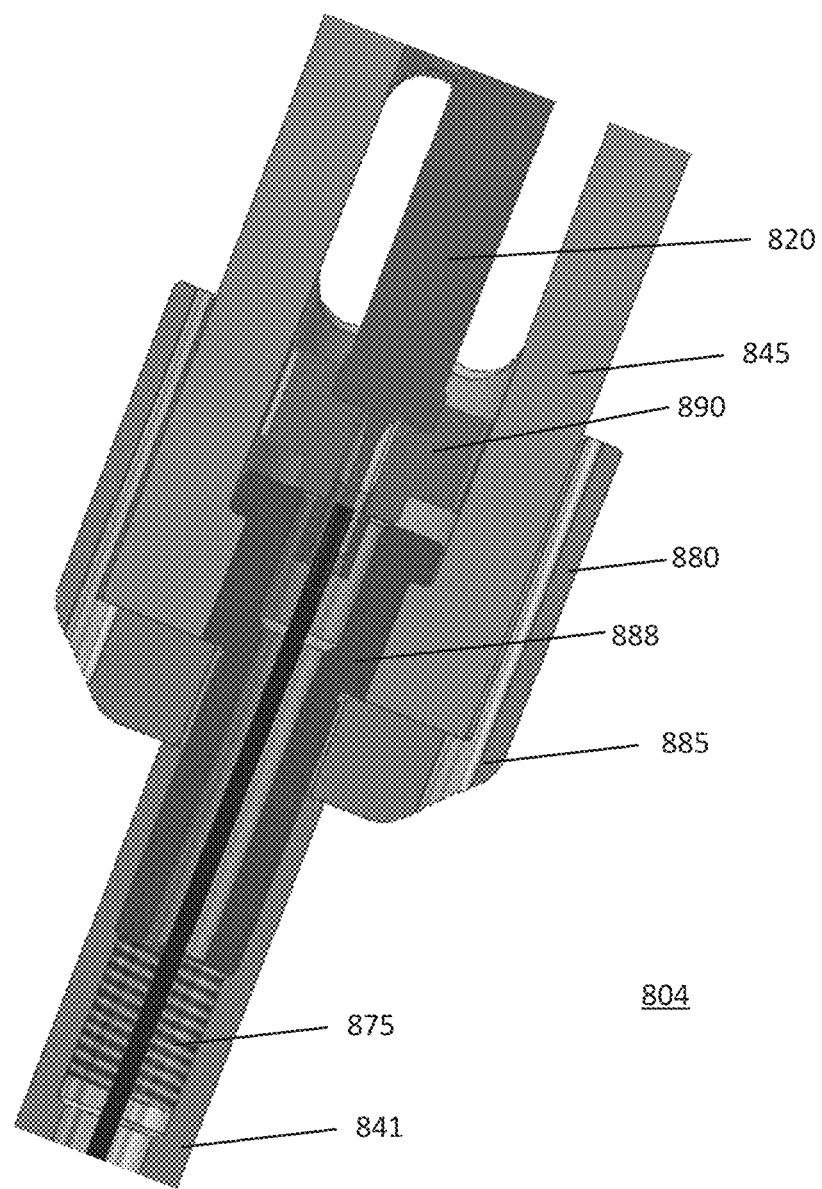
FIG. 8 is a cross-sectional side view of a detail of the portion of the resistor subassembly of FIG. 7.

FIG. 8 is a cross-sectional side view of a portion of the resistor subassembly 704 from FIG. 7. Referring to FIGS. 1-8, inside of the housing 845 and positioned between the resistor 820 and the shield cup 880 is a gasket 890 that is used to center resistor 820. In other example embodiments, the gasket 890 is not used. In yet other example embodiments, an alternative to a gasket (e.g., silicone) is used.

The example embodiment illustrated in FIG. 8 shows the shield cup 880 wrapping around the outside of a portion of housing 845. The shield cup 880 in this case has multiple components. Specifically, the shield cup 880 has an outer portion 885 and a coupler 888. The coupler 888 may be in electrical contact with shield cup 880 and conductive tube 841, and all three may be grounded through, for example, connection to the tank 105 of the recloser 190 to reduce the effect of induced current.

Figure 9D:
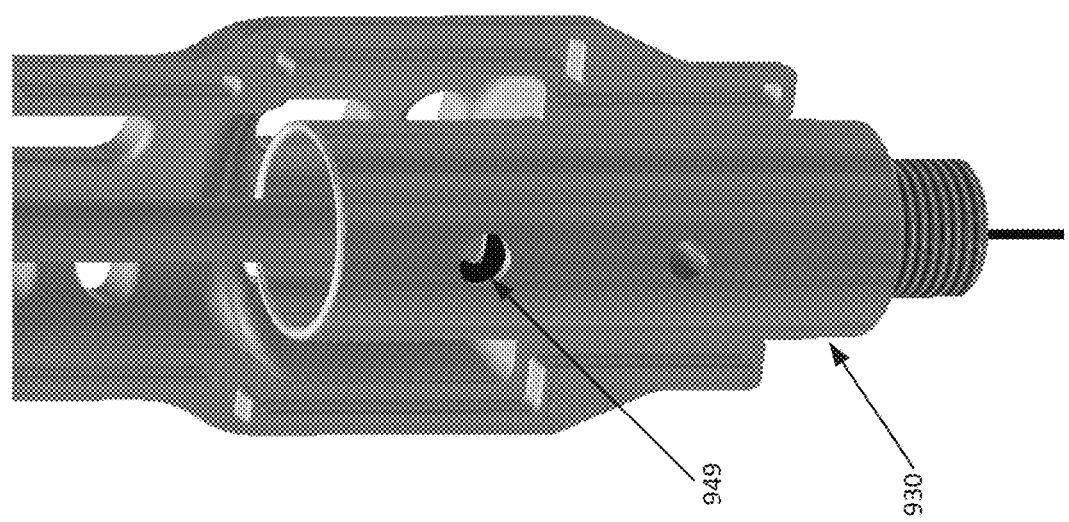
Figure 9C:
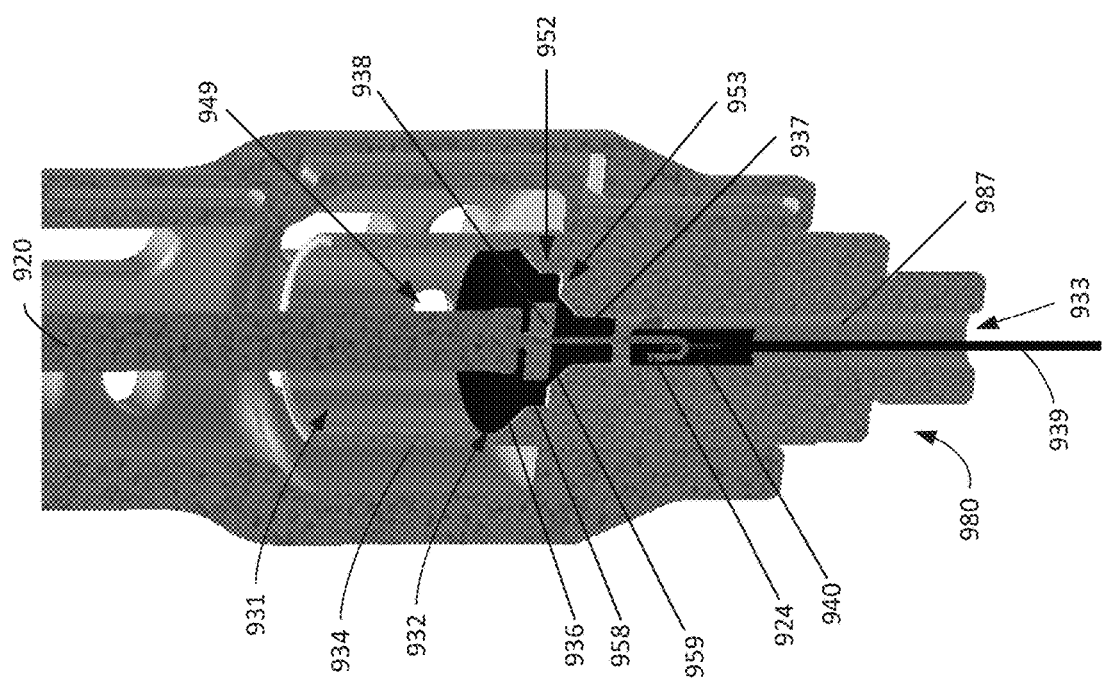

FIGS. 9A-9D show various views of another portion of a resistor subassembly in accordance with certain example embodiments. Specifically, FIG. 9A shows a top-side perspective view of the portion 993 of the resistor subassembly. FIG. 9B shows a top-side cross-sectional perspective view of a detail of the portion 993 of the resistor subassembly of FIG. 9B, with only one of the two pieces of the housing 945 shown, giving the housing 945 a cross-sectional appearance in FIG. 9B. FIG. 9C shows a top-side cross-sectional perspective view of the portion 993 of the resistor subassembly of FIG. 9B, focusing on the shield cup 980. FIG. 9D shows a top-side perspective view of the portion 993 of the resistor subassembly, as in FIG. 9C, except that in FIG. 9D, the shield component 930 is not shown in cross-section.

Referring to FIGS. 1-9D, the portion 993 of the resistor subassembly of FIGS. 9A-9D is substantially the same as the portion 492 of the resistor subassembly of FIG. 4 above, except as described below. For example, in this case, instead of tabs and apertures, the multiple pieces of the housing 945 are coupled to each other using one or more coupling devices 989 (threaded screws) that are disposed within threaded apertures that traverse some or all of the housing 945.

Further, the components and configuration of the sealing device of the shield component 930 of the shield cup 980 that prevents a fluid in a volume of space on one side of the seal device from entering a volume of space on the other side of the seal device is different relative to what is shown and described above. Specifically, in this example, there are five volumes of space within the shield component 930. Aside from the first volume of space 931, which corresponds to the first volume of space 231 of FIG. 2B, defined by the wall 934, there are three volumes of space here in place of the second volume of space 232 in FIG. 2B.

Below the cylindrical first volume of space 931 formed by the wall 934 of the shield component 930 of FIG. 9C, wall 936 forms a conical second volume of space 932. Below the conical second volume of space 932 formed by wall 936 is cylindrical third volume of space 952 formed by wall 958, below which is conical fourth volume of space 953 formed by wall 959. The conical shapes of the second volume of space 932 and the fourth volume of space 953 would be continuous if not broken by the cylindrical third volume of space 952 formed by wall 958. The cylindrical third volume of space 952 formed by wall 958 forms a ledge against which a washer 938 (or some other component, like a plug 937) can be disposed, offering more stability.

The shape and size of the washer 938 can vary. For example, if the wall 958 is not continuous around the perimeter of the shield component 930, then the washer 938 can have one or more of a number of features (e.g., recesses, protrusions, angled side walls) to help the washer 938 fit a certain way (e.g., snugly) against the wall 958. Further, the plug 937 in this case is at least partially disposed in a fourth volume of space 953 formed by wall 959, directly under the washer 938. In certain example embodiments, the plug 937 can be exchanged for a washer 938 or some other sealing component, and there can be no other component disposed above or below the plug 937, disposed in the location where the washer 938 is shown.

As with the example above, the point of connection between the second lead 924 of the resistor 920 and the wire 939 is enclosed in a protective material 940 (e.g., shrink wrap, electrical tape) to help secure the point of connection and/or to prevent the point of connection from being exposed to contaminants. In addition, there are one or more (in this case, two) apertures 949 (in this case, holes) in one or more walls (in this case, wall 934) of the shield component 930. In certain example embodiments, the apertures 949 are located above the sealing devices (in this case, the plug 937 and the washer 938). Further, any of these apertures (aperture 949, aperture 946) can have any of a number of other features. For example, as shown in FIG. 9B, apertures 946 form a non-perpendicular angle with the wall of the housing 945. This allows for insulating material (e.g., insulating material 560) to be injected through the apertures 949 directly into the volumes of space disposed above the sealing devices. This also allows for more controlled injection of the insulating material within the shield component 930, which can protect one or more of the more fragile components within the housing 945 and/or within the shield cup 980.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. It should be understood that although the description has largely been limited to a vacuum switching apparatus, the features described may be used in conjunction with other types of electrical devices. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein. Accordingly, other implementations are within the scope of the following claims.

What is claimed is:

1. A resistor subassembly comprising:
   a resistor having a first end and a second end;
   a conductive member, wherein the conductive member is coupled to the first end of the resistor;
   a shield cup; and
   a housing, wherein the housing includes at least one housing wall having at least one aperture, and wherein the housing encloses at least a portion of the resistor and overlaps with at least a portion of the shield cup,
   wherein a housing volume of space between the at least one housing wall of the housing and the resistor is substantially filled with an insulating material and at least an outside of the housing is substantially covered with the insulating material,
   wherein the shield cup comprises a conductive shielding component having a first interior wall defining a first volume of space, a second interior wall defining a second volume of space, and a third interior wall defining a third volume of space,
   wherein the conductive shielding component further comprises a sealing device, wherein the first interior wall of the conductive shielding component at least partially encloses the second end of the resistor, and wherein the second interior wall encloses at least a portion of the sealing device.

2. The resistor subassembly of claim 1, wherein the sealing device comprises:
   a plug sized to fit in the second volume of space of the conductive shield component; and
   an insulating washer positioned to reinforce the plug in the second volume of space.

3. The resistor subassembly of claim 2, wherein the conductive shield component is electrically grounded.

4. The resistor subassembly of claim 1, wherein the first interior wall of the conductive shield component includes at least one aperture.

5. The resistor subassembly of claim 1, further comprising a conductive tube having a first end coupled to the shield cup.

6. The resistor subassembly of claim 5, wherein at least a portion of the conductive member is covered with the insulating material and at least a portion of the conductive tube is covered with the insulating material.

7. An electrical apparatus, comprising:
   a resistor subassembly comprising:
      a resistor having a first end and a second end;
      a conductive member, wherein the conductive member is coupled to the first end of the resistor;
      a shield cup; and
      a housing, wherein the housing includes at least one housing wall having at least one aperture, and wherein the housing encloses at least a portion of the resistor and overlaps with at least a portion of the shield cup; and
   a voltage detection circuit configured to detect the current from the second end of the resistor,
   wherein a housing volume of space between the at least one housing wall of the housing and the resistor is substantially filled with an insulating material and at least an outside of the housing is substantially covered with the insulating material.

8. The electrical apparatus of claim 7, wherein the electrical apparatus further comprises a switching apparatus.

9. The electrical apparatus of claim 7, at least a portion of the shield cup is enclosed by the housing.

10. The electrical apparatus of claim 7, wherein the shield cup comprises an outer portion and a coupler disposed within the outer portion.

11. The electrical apparatus of claim 10, wherein at least a portion of the housing is disposed between the coupler and the outer portion of the shield cup.

12. The electrical apparatus of claim 11, further comprising a gasket disposed adjacent to the second end of the resistor and the coupler of the shield cup.

13. The electrical apparatus of claim 7, wherein the at least one aperture in the at least one housing wall comprises a feature that regulates flow of the insulating material into the housing volume of space.

14. The electrical apparatus of claim 7, further comprising a terminal, wherein the conductive member is coupled to the terminal.

15. The electrical apparatus of claim 7, further comprising a conductive tube having a first end and a second end, wherein the first end of the conductive tube is coupled to the shield cup, wherein the second end of the conductive tube is coupled to a tank of the switching apparatus.

16. The electrical apparatus of claim 15, wherein a portion of the second end of the resistor is coupled to a wire disposed within the conductive tube, wherein the wire and the second end of the resistor coupled to each other are enclosed in a protective material.

* * * * *